United States Patent [19]
Fontana et al.

[11] Patent Number: 5,495,195
[45] Date of Patent: Feb. 27, 1996

[54] OUTPUT BUFFER FOR A HIGH DENSITY PROGRAMMABLE LOGIC DEVICE

[75] Inventors: Fabiano Fontana, Santa Clara; Bradley A. Sharpe-Geisler, San Jose, both of Calif.

[73] Assignee: Advanced Micro Devices, Inc., Sunnyvale, Calif.

[21] Appl. No.: 341,499

[22] Filed: Nov. 17, 1994

[51] Int. Cl.$^6$ .......................... H03K 17/16; H03K 17/62
[52] U.S. Cl. ........................ 327/108; 327/379; 327/404
[58] Field of Search ................................. 327/108, 379, 327/404

[56] References Cited

U.S. PATENT DOCUMENTS

| | | | |
|---|---|---|---|
| 4,958,086 | 9/1990 | Wang et al. | 327/404 |
| 4,977,341 | 12/1990 | Stein | 327/404 |
| 5,023,472 | 6/1991 | Hashimoto et al. | 327/108 |
| 5,025,181 | 6/1991 | Farmer | 327/404 |
| 5,369,316 | 11/1994 | Chen et al. | 327/379 |
| 5,410,268 | 4/1995 | Sharpe-Geisler | 327/170 |
| 5,430,335 | 7/1995 | Tanoi | 327/379 |

*Primary Examiner*—Margaret Rose Wambach
*Attorney, Agent, or Firm*—Fliesler, Dubb, Meyer & Lovejoy

[57] ABSTRACT

An output buffer circuit for a high density programmable logic device. The output buffer includes inverters having n-channel pull up and pull down transistors for driving pull up and pull down transistors providing the buffer output. By utilizing inverters with n-channel replacing p-channel transistors, crowbar resulting from a different number of inverters required to drive the pull up and pull down transistors which provide the buffer output is prevented. By utilizing n-channel rather than p-channel transistors, mobility is increased and Miller capacitance is reduced, reducing loading of the buffer input. To provide the rail-to-rail voltage of p-channel transistors which can further increase switching speed, p-channel pull up transistors are provided with circuitry to turn the p-channel transistors on after the n-channel transistors have turned on and turn the p-channel transistors off after the buffer output switches. To further increase switching speed, the buffer includes circuitry to reduce voltage on the gates of the pull up or pull down transistors providing the buffer output after the p-channel transistor driving its gate turns off. To enable control of additional power consumption occurring with increased buffer operation speed, the buffer provides a selectable fast/slow mode wherein features of the buffer which increase operation speed may be selectively enabled or disabled.

14 Claims, 9 Drawing Sheets

OUTPUT BUFFER FOR A HIGH DENSITY PROGRAMMABLE LOGIC DEVICE

BACKGROUND OF THE INVENTION

1. Field of the Invention

The present invention relates to output buffers with circuitry to increase operation speed. More particularly, the present invention relates to output buffers for high density programmable logic devices (PLDs).

2. Description of the Related Art

FIG. 1 shows a block diagram for a typical high density PLD such as the MACH130 manufactured by Advanced Micro Devices, Inc. As shown, the high density PLD includes four programmable array logic (PAL) blocks 101–104 interconnected by a programmable switch matrix 106. The PAL blocks 101–104 can be viewed as independent PLD devices on the chip, each similar to the popular lower density 22V10 PAL device, also available from Advanced Micro Devices, Inc. The switch matrix 106 connects the PAL blocks to each other and to all I/O pins 111–114 enabling a device, such as the MACH130, to provide six times the logic capability of the 22V10.

FIG. 2 shows greater detail for one quarter of the PLD block diagram of FIG. 1, including PAL block 101 as connected to switch matrix 106. Note that circuit components, such as switch matrix 106 carried forward from FIG. 1 are similarly labeled in FIG. 2, as will be circuit components carried forward in subsequent figures. PAL block 101 receives inputs, such as the 26 inputs shown, from the switch matrix 106 in input buffers 202. Input buffers 202 buffer the signals to AND array and logic allocator circuitry 204 which provides programmable AND and OR logic between the input buffers 202 and output logic macrocells 206.

The output logic macrocells 206 are programmable to provide registered or combinatorial outputs. The outputs of the macrocells 206 are provided to tri-state output buffers 208 and are also provided on feedback lines to the switch matrix 106.

Each tri-state output buffer 208 can be enabled for use as an output buffer, or disabled so that I/O ports 111 can provide input signals to the PLD. Enabling or disabling signals for the tri-state buffers are provided by the AND array and logic allocator circuit 204. When the tri-state output buffers 208 are enabled, outputs are provided from the output buffers 208 through I/O ports 111 as well as through feedback lines to the switch matrix 106. When the output buffers 208 are disabled, input signals from external circuitry are provided through I/O ports 111 to the switch matrix 106. The switch matrix 106 includes circuitry to distribute the signals received from the tri-state output buffers 208, I/O ports 111 and macrocells 206 back to the PAL blocks 101–104.

Circuitry for output buffers of a high density PLD can be configured to provide more speed than a low density PLD such as the 22V10. A low density PLD is typically provided in a package with only one ground pin connection, but a high density PLD is typically provided in a larger package with multiple ground pins. With a limited number of ground pins, the lower density PLDs typically experience more ground bounce noise, limiting the speed at which the output buffers can switch in comparison to output buffers for high density PLDs.

FIG. 3 shows conventional circuitry for a buffer 300 which may be configured with enabling/disabling circuitry for use as one of the tri-state buffers 208 of FIG. 2. The buffer 300 receives a data signal DOUT, such as an output of one of macrocells 206 of FIG. 2, at its input and provides an output signal OUT at its output to external circuitry on a line such as one of I/O ports 111 of FIG. 2. The DOUT signal is provided along a first path through two series inverters 306 and 308 to the gate of a pull up transistor 302. The DOUT signal is provided along a second path through a single inverter 310 to the gate of a pull down transistor 304. Inverters 306, 308 and 310 include a p-channel pull up transistor and an n-channel pull down transistor. The output signal OUT is pulled up to $V_{DD}$ by the pull up transistor 302. The output signal OUT is pulled down to $V_{SS}$ by the pull down transistor 304. The circles on transistors, such as the pull up transistors of inverters 306, 308 and 310, indicate a p-channel transistor, while transistors without the circles are n-channel transistors.

The circuitry of FIG. 3 has several disadvantages. First, by using two inverters 306 and 308 to drive the pull up transistor 302 and one inverter 310 to drive pull down transistor 304, the additional inverter driving the pull up transistor 302 can cause added delay resulting in transistors 302 and 304 being turned on together for an extended time period (i.e. crowbar).

Additionally, because the p-channel transistors of inverters 306, 308 and 310 have ½ to ⅓ the drive capability of the same size n-channel transistor due to lower mobility, the p-channel transistors must be larger, thus loading the input of the buffer 300. Additionally, with p-channel transistors, Miller effect parasitic capacitance is greater due to the larger transistor size. The Miller effect capacitance adds in series with parasitic drain capacitance, further increasing loading of the input of buffer 300.

SUMMARY OF THE INVENTION

The present invention provides a buffer which reduces the possibility of crowbar resulting from the difference in delay provided by a circuit utilizing two series inverters driving a pull up transistor and a single inverter driving a pull down transistor as in FIG. 3.

The present invention further provides a buffer which reduces loading on the input in comparison to prior art circuitry such as shown in FIG. 3.

The present invention is a buffer which may be utilized as an output buffer of a high density PLD. The output buffer of the present invention includes inverters with both n-channel pull up and pull down transistors for driving pull up and pull down transistors providing the buffer output. By utilizing inverters with n-channel replacing p-channel transistors, the possibility of crowbar resulting from a different number of inverters required to drive the pull up and pull down transistors which provide the buffer output is reduced. By utilizing n-channel rather than p-channel transistors, mobility is increased and Miller capacitance is reduced, reducing loading of the buffer input.

To provide the rail-to-rail voltage of p-channel transistors which can further increase switching speed, the present invention further includes p-channel pull up transistors provided with circuitry to turn on the p-channel transistors after the n-channel pull up transistors of a corresponding inverter have turned on and turn the p-channel transistors off after the buffer output switches.

To further increase switching speed, the present invention additionally includes circuitry to reduce voltage on the gate of a pull up or pull down transistor providing the buffer output after the p-channel transistor driving its gate turns off.

To enable control of additional power consumption necessary to provide increased buffer operation speed, the present invention further provides a selectable fast/slow mode wherein features of the present invention which increase operation speed may be selectively enabled or disabled.

BRIEF DESCRIPTION OF THE DRAWINGS

Further details of the present invention are explained with the help of the attached drawings in which.

DETAILED DESCRIPTION

Figure 4:
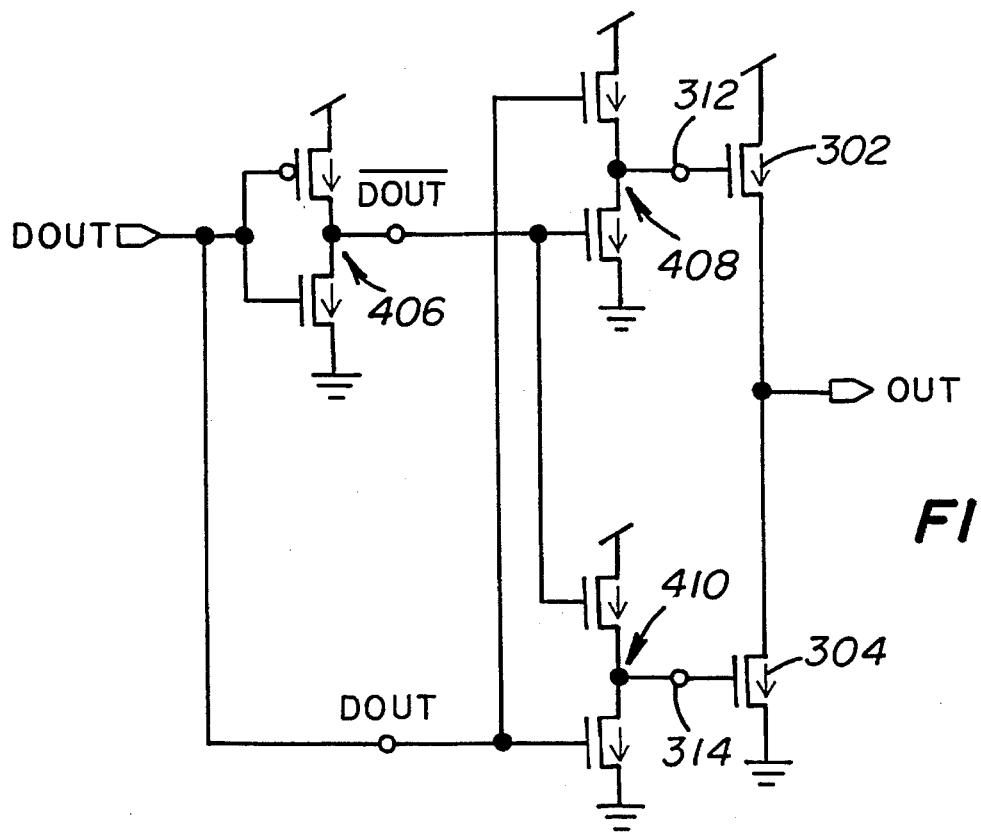
FIG. 4 shows a first embodiment of a buffer of the present invention.

First Embodiment—FIG. 4.

FIG. 4 shows a first embodiment of a buffer of the present invention. The circuit of FIG. 4 modifies the circuitry of FIG. 3 to substitutes inverters 308 and 310 having p-channel pull-up transistors with inverters 408 and 410 having n-channel pull up transistors. The gate of the pull up transistor of inverter 408 and the gate of the pull down transistor of inverter 410 are connected to receive the data signal DOUT at the buffer input. The gate of the pull down transistor of inverter 408 and the gate of the pull up transistor of inverter 410 are connected to receive the inverse of the buffer input, $\overline{\text{DOUT}}$, provided at the output of inverter 306. The outputs of inverters 408 and 410 are connected to gates of respective pull up and pull down transistors 302 and 304 which provide the buffer output.

Figure 3:
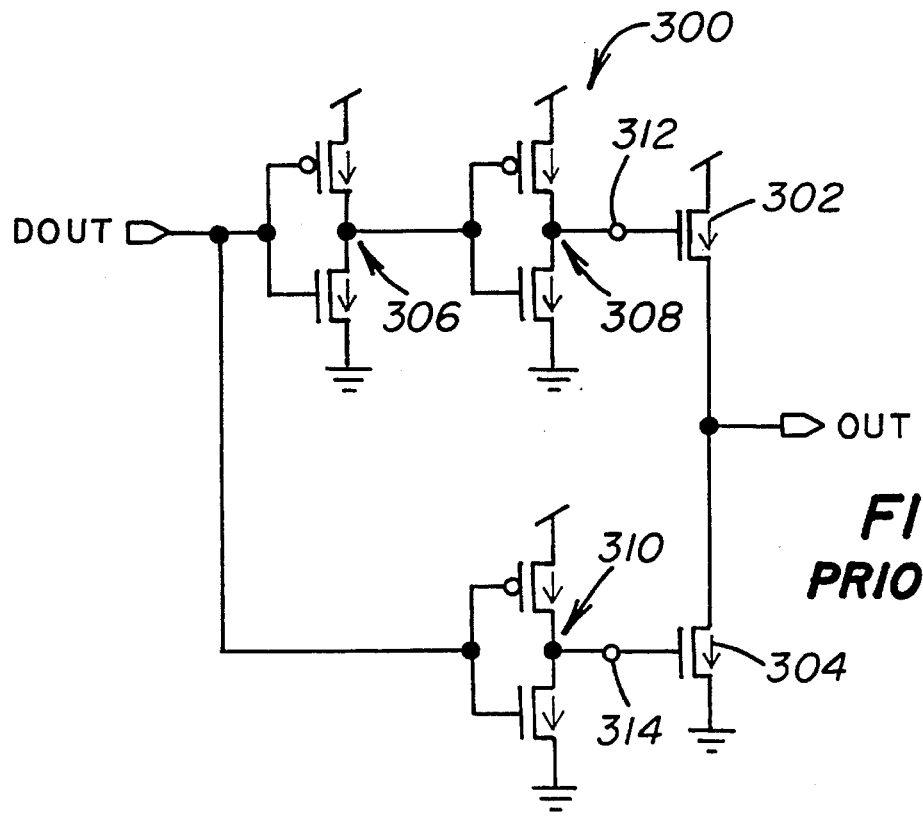
FIG. 3 shows conventional circuitry for a buffer which may be configured for use as an output buffer in a high density PLD.

By connecting the gates of pull up and pull down transistors of inverters 408 and 410 as shown in FIG. 4, the delay from the buffer input to the gates of transistors 302 and 304 will be substantially equal, unlike with the circuitry of FIG. 3. Thus, turn on of transistors 302 and 304 at the same time, or crowbar, is less likely to occur with the connection of FIG. 4 than with the connection of FIG. 3.

Additionally, by utilizing n-channel pull up transistors in the inverters 408 and 410, loading is reduced in comparison to inverters 308 and 310 of FIG. 3 which use p-channel transistors. Loading is reduced because of the lower size requirement of an n-channel transistor to drive the same load. The lower size transistor also decreases Miller effect capacitance which can provides additional loading to the buffer input.

Further by utilizing n-channel pull up transistors in the inverters 408 and 410, the speed of pull up of the gates of transistors 302 and 304 is initially increased in comparison to utilizing p-channel pull up transistors as in FIG. 3. However, a disadvantage to utilizing n-channel transistors is that a threshold drop occurs which does not occur when utilizing p-channel transistors.

Figure 5:
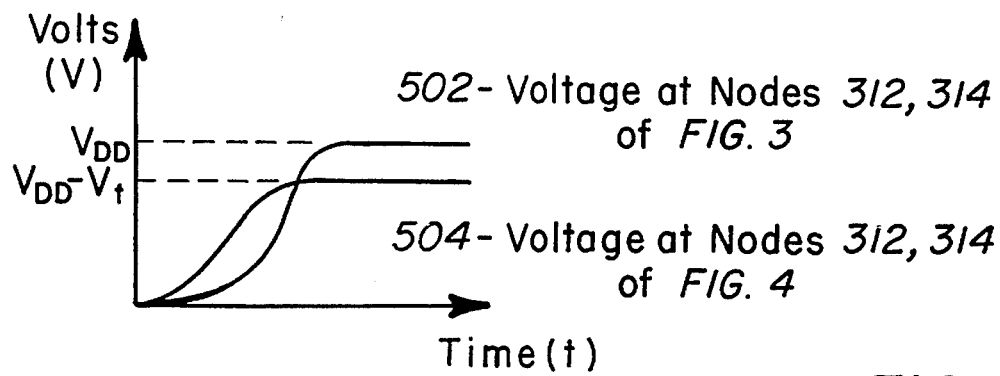
FIG. 5 plots curves showing the increased pull up speed of inverters using an n-channel transistor versus a p-channel transistor and the threshold voltage drop of an n-channel transistor versus a p-channel transistor as voltage levels off.

FIG. 5 plots curves showing the increased pull up speed of inverters using an n-channel transistor versus a p-channel transistor and the threshold voltage drop of an n-channel transistor versus a p-channel transistor as voltage levels off. FIG. 5 shows a curve 502 plotting the voltage occurring at one of nodes 312 or 314 at the gate of a respective transistor 302 or 304 of FIG. 3 for a time period when a pull up transistor of a respective inverter 308 or 310 initially turns on. Additionally, FIG. 5 shows a curve 504 plotting the voltage occurring at one of nodes 312 or 314 of FIG. 4 for a time period when a pull up transistor of a respective inverter 408 or 410 turns on. As shown, although curve 504 initially increases voltage more rapidly over time due to the n-channel transistors, curve 504 levels off at a lower voltage $V_{DD}$–vt, where vt is the threshold drop of a respective n-channel pull up transistor of one of inverters 408 or 410. Curve 502 levels off at $V_{DD}$ without a threshold drop due to the p-channel transistors.

Figure 6:
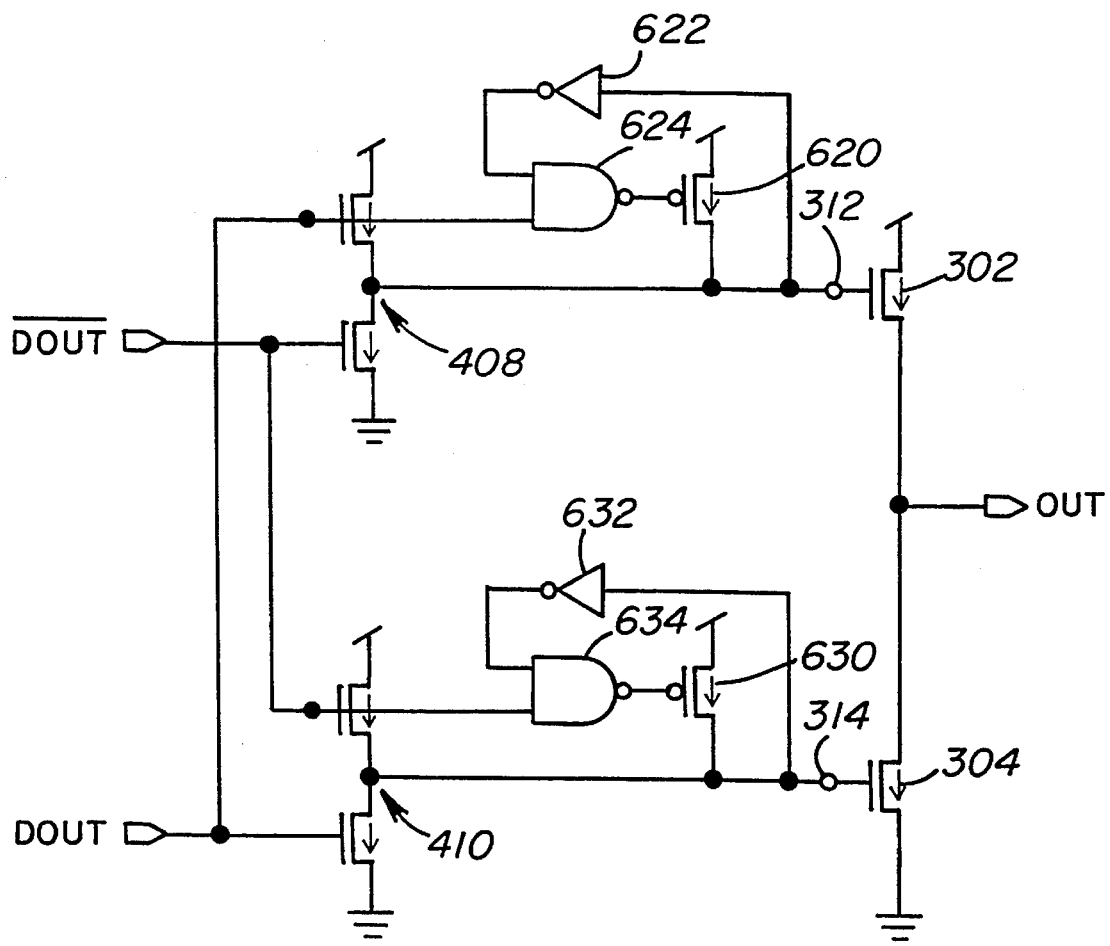
FIG. 6 shows a second embodiment of the present invention which adds circuitry to the circuitry of FIG. 4 to provide the fast pull-up of an n-channel transistor as well as the ability to pull up to $V_{DD}$ of a p-channel transistor.

Second Embodiment—FIG. 6

FIG. 6 shows a second embodiment of the present invention which adds circuitry to the circuitry of FIG. 4 to provide the fast pull-up of an n-channel transistor as shown in curve 504 of FIG. 5 as well as the ability to pull up to $V_{DD}$ of a p-channel transistor as shown in curve 502. In FIG. 6 two p-channel pull up transistors 620 and 630 are added to the circuitry of FIG. 4. The drains of transistors 620 and 630 are connected to the gates of respective transistors 302 and 304 at respective nodes 312 and 314. FIG. 6 additionally adds NAND gates 624 and 634 and inverters 622 and 632 to the circuitry of FIG. 4. The gate of transistor 620 is driven by NAND gate 624 which has one input connected to receive the DOUT signal and a second input connected to node 312 by inverter 622. Likewise, the gate of transistor 630 is driven by NAND gate 634 which has one input connected to receive the $\overline{\text{DOUT}}$ signal and a second input connected to node 314 by inverter 632.

In operation, the circuitry of FIG. 6 carried over from FIG. 4 includes the n-channel pull up transistors of inverters 408 and 410 to provide the fast pull up of nodes 312 and 314 when the DOUT signal switches states as described with respect to FIG. 4. The p-channel transistors 620 and 630 are added and controlled to turn on after a respective node 312 or 314 to which they are connected is initially pulled up by a corresponding n-channel transistor to pull nodes 312 or 314 the rest of the way up to $V_{DD}$ to enable an even faster turn on of a corresponding transistor 302 or 304. The p-channel transistors 620 and 630 are further controlled to turn off shortly after respective nodes 312 and 314 reach $V_{DD}$ to enable the n-channel transistors of inverters 408 and 410 to provide the more rapid initial pull up during a later transition of DOUT.

To describe operation of the circuitry of FIG. 6 in more detail, reference to circuitry driving the pull up transistor 302 will be made since operation of circuitry driving the pull down transistor 304 will operate in a similar manner on opposite edges of the DOUT signal. When DOUT switches from low to high, the pull up transistor of inverter 408 will turn on pulling node 312 toward $V_{DD}$. With node 312 initially low, the output of inverter 622 will be high, so with DOUT going high the output of NAND gate 624 will be low after a short gate delay turning on the p-channel transistor 620 to pull node 312 the rest of the way up to $V_{DD}$. After the pull up transistor of inverter 408 pulls node 312 above the threshold of inverter 622, and transistor 302 is turned on, the output of inverter 622 will go low causing the output of NAND gate 624 to go high turning off p-channel transistor 620. When DOUT switches from high back to low, the pull up transistor of invertor 408 turns off while its pull down transistor turns on pulling node 312 down to $V_{SS}$ and turning transistor 302 off. Further, DOUT being low makes the output of NAND gate 624 high, keeping transistor 620 off, irrespective of the state of node 312.

Figure 7:
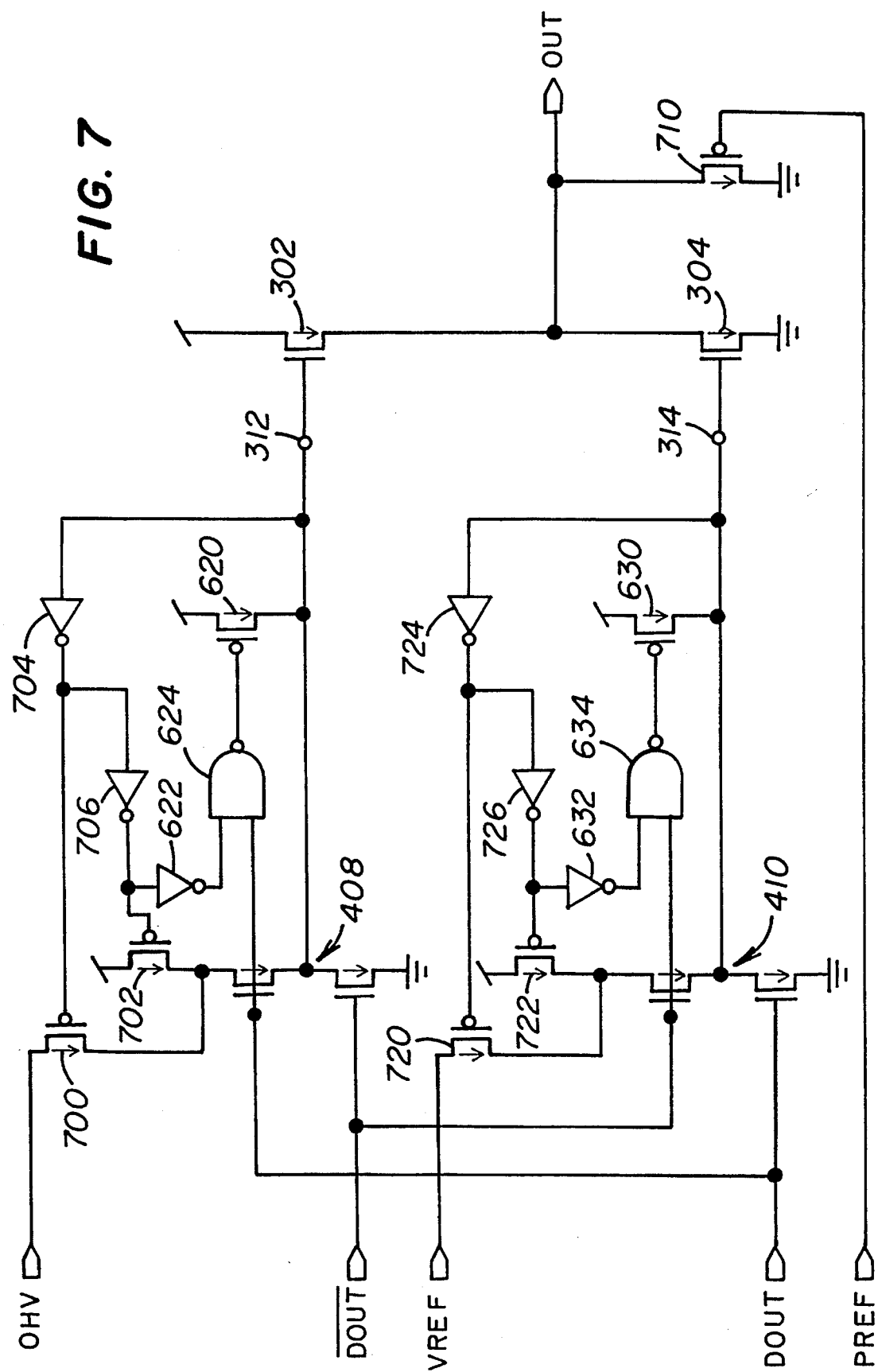
FIG. 7 shows a third embodiment of the present invention which adds circuitry to the circuitry of FIG. 6 to enable faster turn off of transistors 302 and 304.

Third Embodiment—FIG. 7

FIG. 7 shows a third embodiment of the present invention which adds circuitry to the circuitry of FIG. 6 to enable faster turn off of transistors 302 and 304. Fast turn off of transistors 302 and 304 is accomplished by maintaining the gate voltage applied to respective transistors 302 and 304 near threshold just before turn off.

To hold node 312 near the threshold of transistor 302 at turn off, FIG. 7 adds p-channel transistors 700, 702 and 710 and inverters 704 and 706 to the circuitry of FIG. 6. Switching transistor 700 has source-to-drain paths connecting a voltage reference OHV which is just above the threshold of transistor 302 to the pull up transistor drain of inverter 408. Switching transistor 702 has a source-to-drain path connecting $V_{DD}$ to the pull up transistor drain of inverter 408. Inverters 704 and 706 are connected in series and connect the input of inverter 622 to node 312. The output of inverter 704 is further connected to the gate of transistor 700 and the output of inverter 706 is further connected to the gate of transistor 702. Transistor 710 has a source-to-drain path connecting the buffer output to $V_{SS}$ and has a gate controlled by a voltage reference PREF.

In operation of the circuitry added in FIG. 7 described above, when DOUT goes from low to high, inverters 704 and 706 enable only transistor 702 to provide power from $V_{DD}$ to pull up node 312. Once node 312 rises above the threshold of inverter 704 and transistor 302 turns on, inverters 704 and 706 turn transistor 702 off and transistor 700 on to supply power to node 312 from OHV. With a capacitive load on the output OUT, node 312 cannot discharge from $V_{DD}$ to OHV until DOUT goes low, preventing a fast turn off of transistor 302. Transistor 710 provides clamping to enable node 312 to be pulled down to OHV prior to DOUT going low even with a capacitive load on the output OUT to enable fast turn off. Transistor 710 turns on when the OUT signal goes above the voltage of reference PREF plus the threshold of transistor 302.

Figure 8:
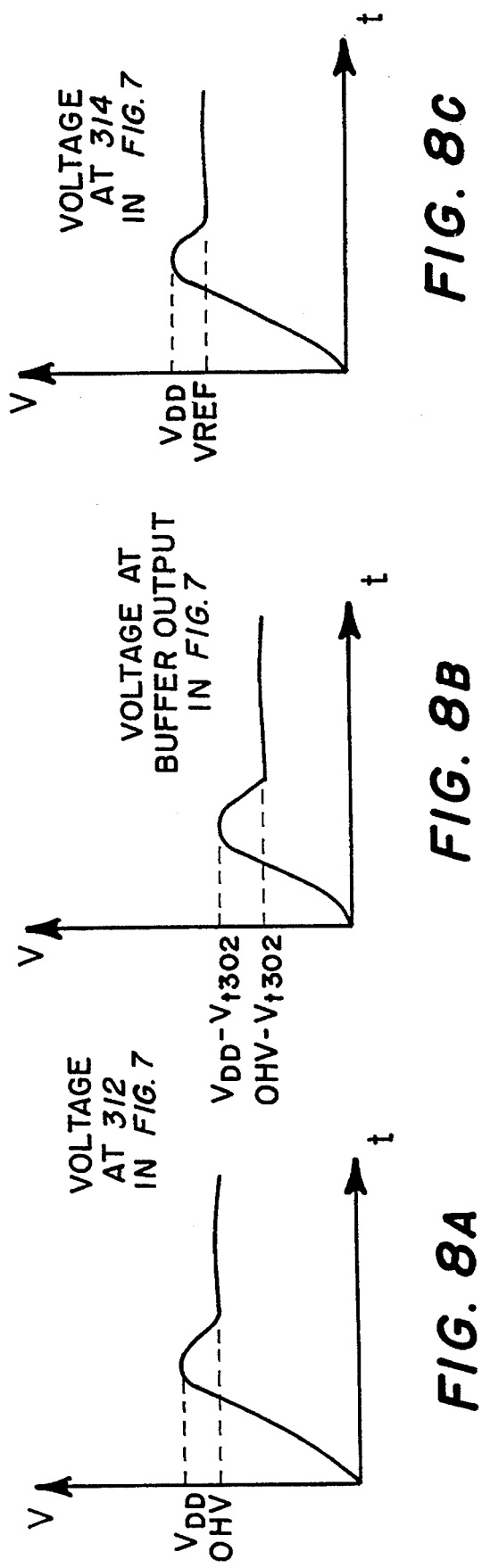
FIG. 8A shows a plot of the voltage on node 312 during and shortly after turn on of transistor 302.
FIG. 8B shows a plot of the voltage on the buffer output during and shortly after turn on of transistor 302.
FIG. 8C shows a plot of the voltage on node 314 during and shortly after turn on of transistor 304.

A plot of the voltage on node 312 during and shortly after turn on of transistor 302 is shown in FIG. 8A. Additionally, a plot of the voltage on the buffer output during and shortly after turn on of transistor 302 is shown in FIG. 8B.

To hold node 314 near the threshold of transistor 304 at turn off, FIG. 7 also adds p-channel transistors 720 and 722 and inverters 724 and 726 to the circuitry of FIG. 6. Switching transistor 720 has source-to-drain paths connecting a voltage reference VREF which is just above the threshold of transistor 304 to the pull up transistor drain of inverter 410. Switching transistor 722 has a source-to-drain path connecting $V_{DD}$ to the pull up transistor drain of inverter 410. Inverters 724 and 726 are connected in series and connect the input of inverter 622 to node 312. The output of inverter 724 is further connected to the gate of transistor 720 and the output of inverter 726 is further connected to the gate of transistor 722.

In operation, transistors 720 and 722 and inverters 724 and 726 operate to hold node 314 near the threshold of transistor 302 in a manner similar to which transistors 700 and 702 and inverters 704 and 706 hold node 312 near the threshold of transistor 302, but on opposite edges of DOUT. Because the source of transistor 304 is connected directly to ground, an additional current sink transistor similar to 710 is not required.

A plot of the voltage on node 314 during and shortly after turn on of transistor 304 is shown in FIG. 8C.

Figure 9:
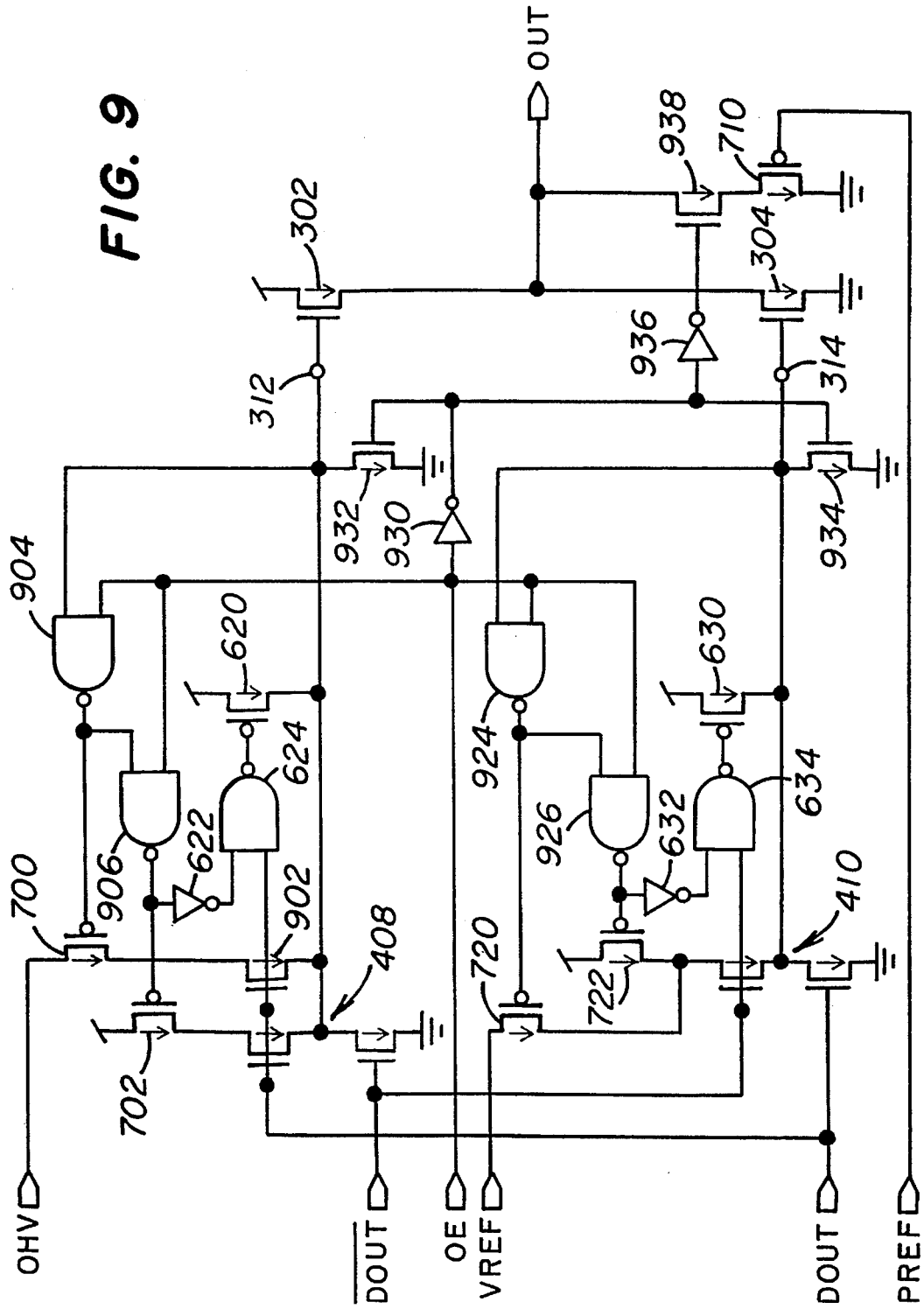
FIG. 9 shows a fourth embodiment of the present invention which modifies the circuitry of FIG. 7 to provide an output enable/disable selection as well as to provide OHV with a limited threshold drop.

Fourth Embodiment—FIG. 9

Figure 1:
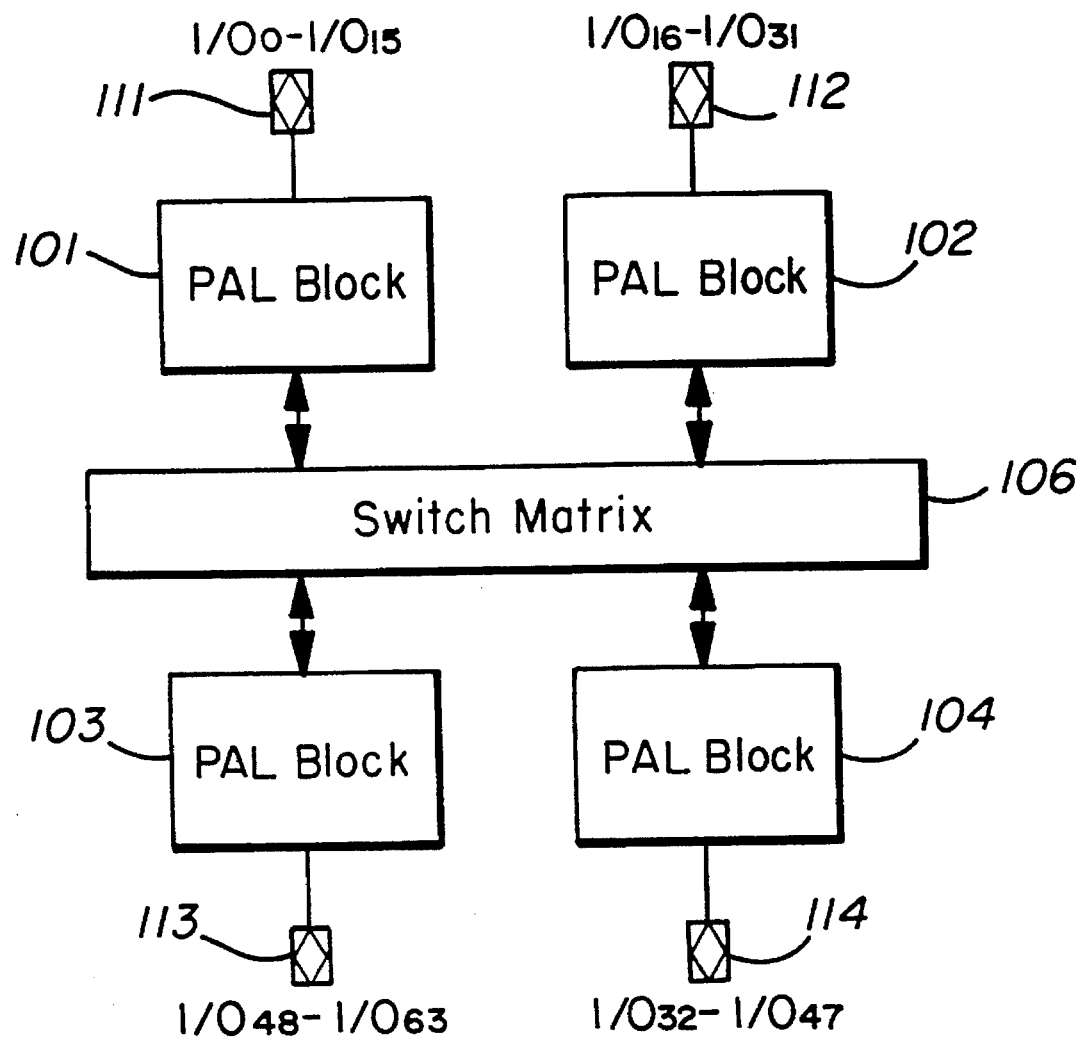
FIG. 1 shows a block diagram for a typical high density programmable logic device (PLD)
Figure 2:
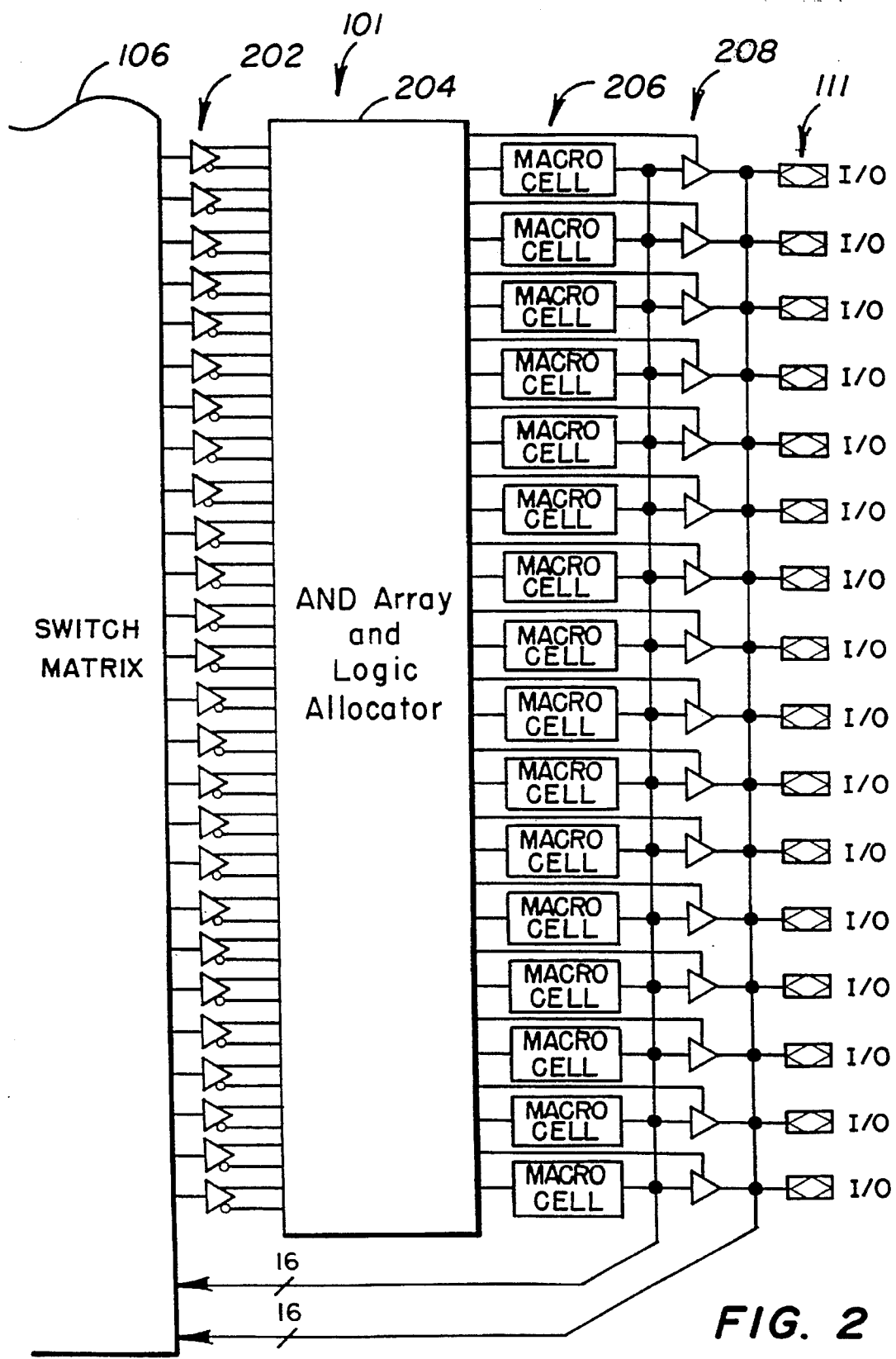
FIG. 2 greater detail for one quarter of the PLD shown in FIG. 1.

FIG. 9 shows a fourth embodiment of the present invention which modifies the circuitry of FIG. 7 to provide an output enable/disable selection as well as to provide OHV with a limited threshold drop to node 312. The output enable/disable selection enables the buffer of FIG. 9 to be utilized as one of the tri-state buffers 208 of FIG. 2. Providing OHV with a limited threshold drop enables turn on of transistor 302 even when the reference providing OHV is limited.

To provide the output enable/disable selection, inverters 704, 706, 724 and 726 of FIG. 7 are replaced with NAND gates 904, 906, 924 and 926 in FIG. 9 with the added input of the NAND gates receiving an output enable/disable signal (OE). Further, to provide the output enable/disable selection, FIG. 9 adds current sink transistors 932 and 934, inverters 930 and 936 and switching transistor 938 to the circuitry of FIG. 7. The OE signal is also provided through inverter 930 to the gates of transistors 932 and 934. Transistors 932 and 934 have source-to-drain paths connecting respective nodes 312 and 314 to $V_{SS}$. The OE signal is also provided from inverter 930 through inverter 936 to the gate of transistor 938 which has a source-to-drain path connecting current sink transistor 710 to the buffer output.

In operation, the added circuitry of FIG. 9 providing output enable/disable selection enables the circuitry of FIG. 9 to perform similar to the circuit of FIG. 7 when OE is high, or the buffer is enabled, and provides a high impedance output and turns off circuitry burning power when OE is low, or the buffer is disabled. With OE high, current sinks 932 and 934 are disabled and switching transistor 938 conducts to connect the source of transistor 710 to the buffer output as in FIG. 7. Further with OE high, NAND gates 904, 906, 924 and 926 function similar to the OR gates 704, 706, 724 and 726 of FIG. 7. With OE low, NAND gates 904, 906, 924 and 926 are disabled turning off transistors which supply power to nodes 312 and 314. Further with OE low, current sinks 932 and 934 are turned on to pull down nodes 312 and 314 to turn off transistors 302 and 304 to provide a high impedance at the buffer output. Additionally with OE low, transistor 938 disconnects transistor 710 from the buffer output to reduce power consumption if a user has tied a pull up transistor to the buffer output.

To provide OHV to node 312 without a threshold drop, FIG. 9 modifies the circuitry of FIG. 7 by adding an n-channel transistor 902 with a cell implant and connecting the drain of transistor 700 to the drain of transistor 902 instead of the pull up transistor of inverter 408 which has a threshold drop. The source of transistor 902 is connected to node 312 and its gate is connected to receive the DOUT signal, similar to the pull up transistor of inverter 408. Removal of a threshold drop of the pull up transistor of inverter 408 is required when the maximum voltage of reference OHV is limited and a threshold drop in providing OHV to node 312 will reduce OHV to a value below that which is required to overcome the threshold of transistor 302. The cell implant of transistor 902 effectively reduces its threshold drop to zero.

Figure 10:
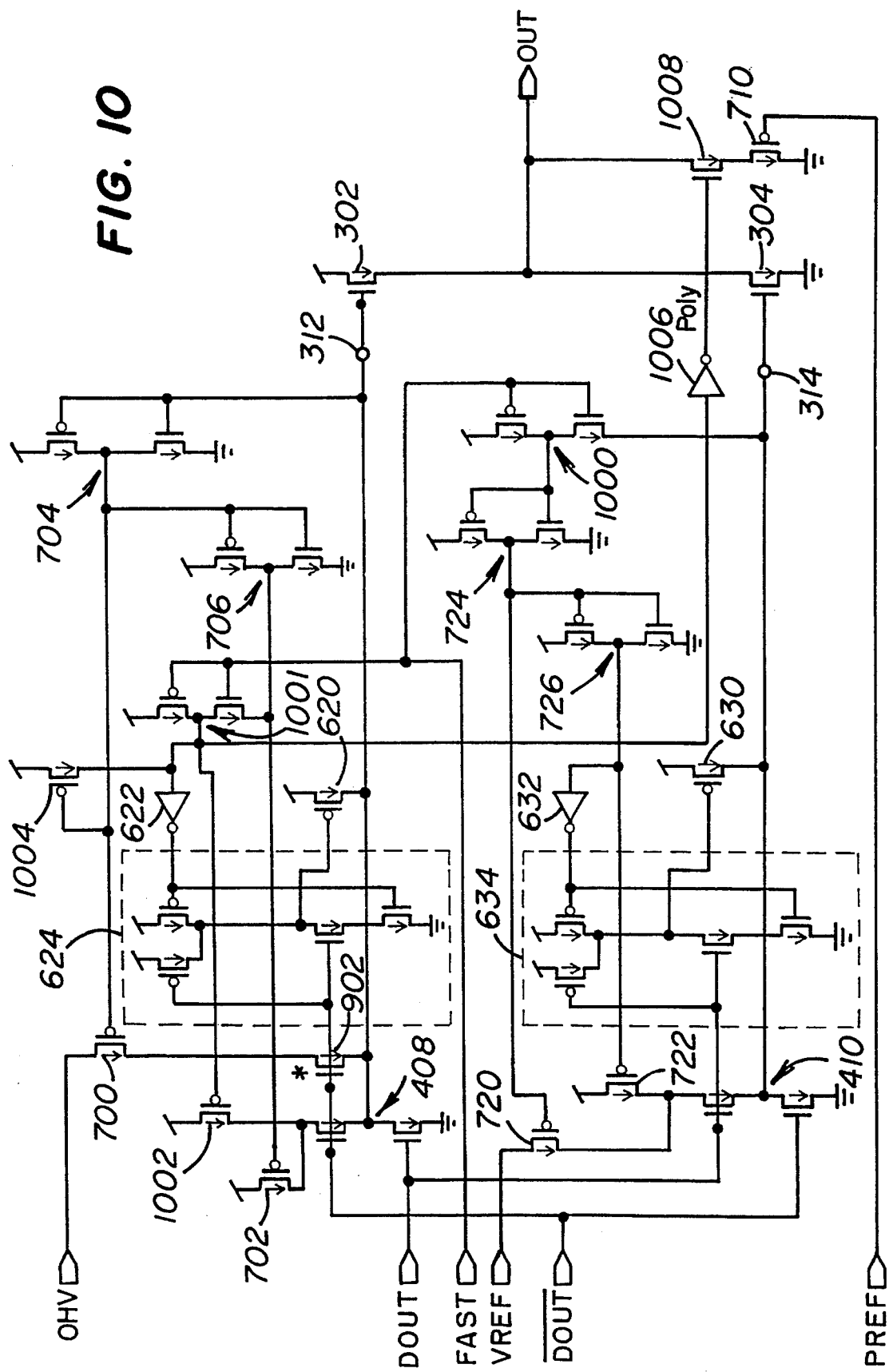
FIG. 10 shows a fifth embodiment of the present invention which modifies of the circuitry of FIG. 7 to provide a fast/slow mode selection as well as to provide OHV with a limited threshold drop.

Fifth Embodiment—FIG. 10

FIG. 10 shows a fifth embodiment of the present invention which modifies the circuitry of FIG. 7 to provide a fast/slow mode selection as well as to provide OHV with a limited threshold drop to node 312 similar to FIG. 9. To facilitate comparison of circuitry in FIG. 10 with subsequent circuitry, the transistors making up inverters 704, 706, 724 and 726 and NAND gates 624 and 634 which are carried over from FIG. 7 is shown in detail.

To provide fast/slow selection, FIG. 10 adds inverters 1000, 1001 and 1006, transistors 1002, 1004 and 1008 and a polysilicon line (poly) to the circuitry of FIG. 7. A signal (FAST) is provided to the gates of inverters 1000 and 1001 to provide fast/slow selection.

The inverter 1001 added in FIG. 10 has a p-channel pull up transistor with a source connected to $V_{DD}$ and a drain connected to the input of inverter 622, and an n-channel pull down transistor with a drain connected to the input of inverter 622 and a source connected to the output of inverter 706. The added inverter 1000 has a p-channel pull up transistor with a source connected to $V_{DD}$ and a drain connected to the input of inverter 724, and a n-channel pull down transistor with a drain connected to the input of inverter 724 and a source connected to node 314. With added inverters 1000 and 1001, inverter 706 is now only connected to inverter 622 through inverter 1001 and inverter 724 is now only connected to node 314 through inverter 1000.

The p-channel transistor 1004 added in FIG. 10 has a gate connected to the output of inverter 704, a source connected to $V_{DD}$ and a drain connected to the input of inverter 622. The added p-channel transistor 1002 has a gate connected to the input of inverter 622, a source connected to $V_{DD}$ and a drain connected to the drain of transistor 702. The added inverter 1006 and polysilicon line (poly) connect the output of inverter 1001 to the gate of added n-channel switching transistor 1008. Switching transistor 1008 has a source-to-drain path connecting the buffer output to the source of transistor 710.

To provide OHV to node 312 without a threshold drop as in FIG. 9, FIG. 10 modifies the circuitry of FIG. 7 by adding an n-channel transistor 902 with a cell implant and connecting the drain of transistor 700 to the drain of transistor 902 instead of the pull up transistor of inverter 408. Further as in FIG. 9, the source of transistor 902 is connected to node 312 and its gate is connected to receive the DOUT signal.

In operation, we first assume that the fast mode is selected with the FAST signal being high. With FAST high, the pull down transistor of inverter 1001 creates a path from the output of inverter 706 to the input of inverter 622 and the pull down transistor of inverter 1000 creates a path from node 314 to the input of inverter 724, enabling the circuitry of FIG. 9 to operate in a manner similar to the circuit of FIG. 7 with operational changes resulting from addition of transistors 1002, 1004 and 1008.

With FAST high, transistor 1004 has gate, source and drain connections similar to the pull up transistor of inverter 706, reducing the time required for inverter 706 to pull up the input of inverter 622 from FIG. 7. Additionally with FAST high, transistor 1002 has gate, source and drain connections similar to transistor 702, reducing the time required for transistor 702 to pull up node 312 from FIG. 7.

With FAST high, an additional change from operation in FIG. 7 is that transistor 1008 is controlled by a signal received from the output of inverter 706 to connect transistor 710 to the buffer output after node 312 is pulled up to $V_{DD}$ and to disconnect transistor 710 from the buffer output after node 312 is pulled down to OHV. The resistance of the polysilicon line (poly) and capacitance of inverter 1006 provide the necessary time delay to enable transistor 1008 to switch at proper time periods. Transistor 710 is disconnected from the buffer output after node 312 reaches OHV to prevent an external pull up transistor connected to the buffer output from continuing to draw power.

We next assume that a slow mode is selected with FAST being low. With FAST low, inverter 1001 provides a high output turning off transistor 1002. Additionally with the output of inverter 1001 high, inverter 622 provides a low output causing NAND gate 624 to provide a high output to the gate of transistor 620 turning it off. Additionally, with the output of inverter 1001 high, inverter 1006 will provide a low output turning transistor 1008 off to disconnect transistor 710 from the buffer output.

With FAST low, inverter 1000 provides a high output causing the output of inverter 724 to be low turning on transistor 720. With the output of inverter 724 low, the output of inverter 726 will go high turning off transistor 722. Additionally with the output of inverter 726 high, the output of inverter 632 will go low causing NAND gate 634 to provide a low output to the gate of transistor 630 turning if off.

Thus, with FAST low in FIG. 10, only the pull up and pull down transistors of inverter 410 drive transistor 304 with power to the pull up transistor of inverter 410 supplied only from VREF through transistor 720. Further with FAST low, only the pull up and pull down transistors of inverter 408 and transistor 902 drive transistor 302. Inverters 704 and 706 are controlled to switch transistors 700 and 702 as in FIG. 7 because with the cell implant transistor 902, power must be initially supplied to node 312 from inverter 408 to enable initial pull up node 312. The p-channel transistors 620 and 630 are turned off to save power because their additional pull up speed is not required. Power is supplied from VREF and OHV when possible, rather than $V_{DD}$, to nodes 312 and 314 also to reduce power consumption.

Figure 11:
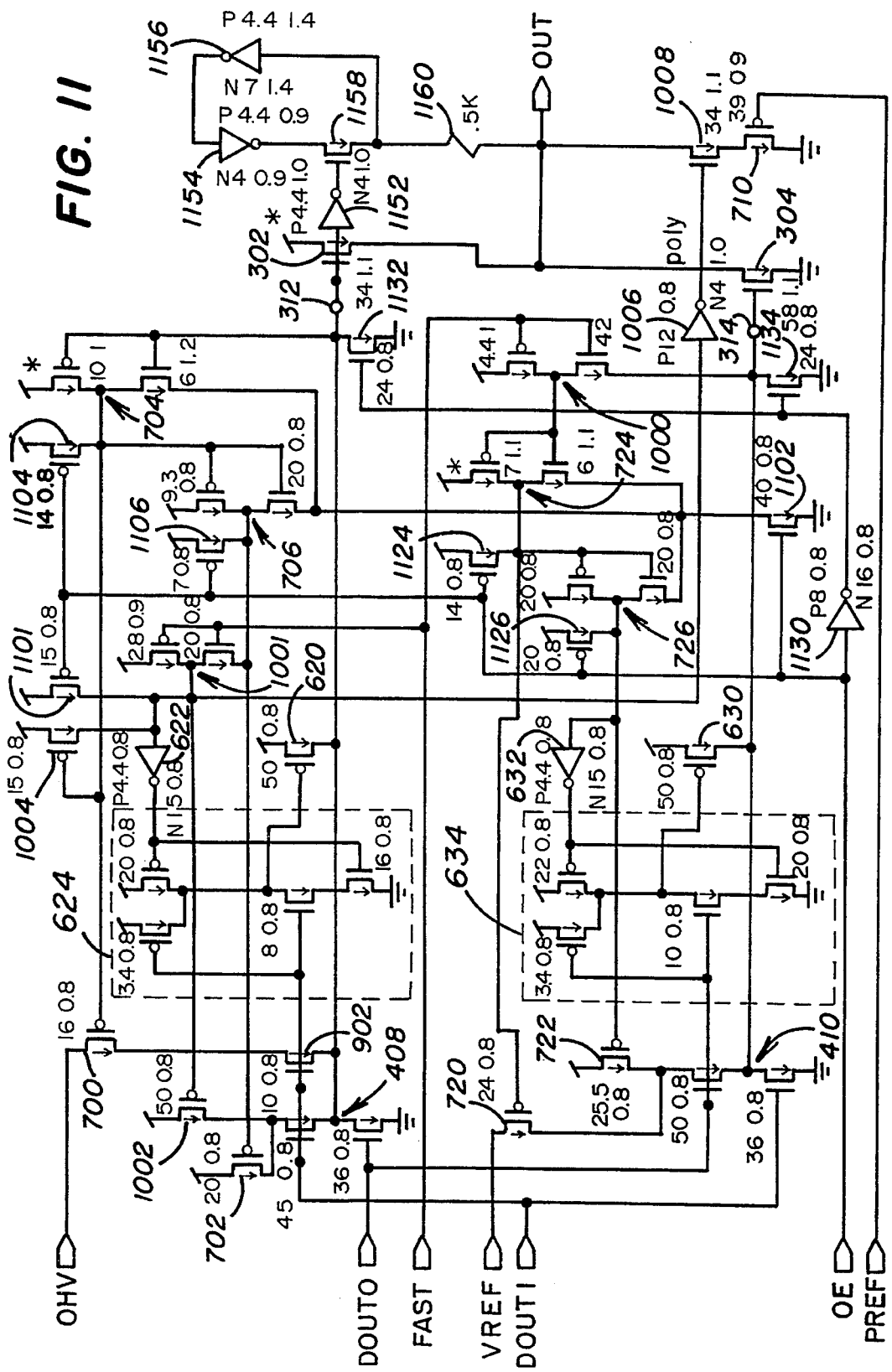
FIG. 11 shows a sixth embodiment of the present invention which adds circuitry to the circuit of FIG. 10 to provide an output enable/disable selection as well as a latch to hold the buffer output state either high or low.

Sixth Embodiment—FIG. 11

FIG. 11 shows a sixth embodiment of the present invention which adds circuitry to the circuit of FIG. 10 to provide an output enable/disable selection as well a latch to hold the buffer output state either high or low. As in FIG. 9, the output enable/disable selection enables the buffer of FIG. 11 to be utilized as one of the tri-state buffers 208 of FIG. 2. The added latch assures the output remains at a high or low value rather than some intermediate level when the output is tri-stated.

To provide the enable/disable selection, inverters 704, 706, 724, 726 and 1001 of FIG. 10 are converted in FIG. 11 to NAND gates similar to FIG. 9. To convert inverters 704, 706, 724, 726 and 1001 to NAND gates, transistors 1101, 1102 1104, 1106, 1124 and 1126 are added in FIG. 11 with gates connected to receive an output enable/disable signal (OE). The p-channel transistors 1101, 1104, 1106, 1124 and 1126 have sources are connected to $V_{DD}$, and drains are connected to respective outputs of inverters 1001, 704, 706, 724 and 726. The source-to-drain path of n-channel transistor 1102 connects the sources of the pull down transistors of inverters 1001, 704, 706, 724 and 726 to $V_{SS}$.

To further provide the output enable/disable selection, FIG. 11 adds current sink transistors 1132 and 1134 and inverter 1130 to the circuitry of FIG. 10 similar to FIG. 9. The OE signal is provided through inverter 1130 to the gates of transistors 1132 and 1134. The source-to-drain path of transistors 1132 and 1134 connect respective nodes 312 and 314 to $V_{SS}$.

In operation, the added circuitry of FIG. 11 providing output enable/disable selection enables the circuitry of FIG. 11 to perform similar to the circuit of FIG. 10 when OE is high, or when the buffer is enabled, and provides a high impedance output and turns off circuitry burning power when OE is low, or the buffer is disabled. With OE high, current sinks 1132 and 1134 are disabled. Further with OE high, transistors 1101, 1104, 1106, 1124 and 1126 do not conduct and transistor 1102 does conduct enabling OR gates 1101, 704, 706, 724 and 726 to function as in the circuitry of FIG. 10. With OE low, transistors 1101, 1104, 1106, 1124 and 1126 conduct and transistor 1102 does not conduct making the outputs of OR gates 1101, 704, 706, 724 and 726 high, despite their inputs, causing turn off of transistors which supply power to nodes 312 and 314 as well as turn off of transistor 1008 which disconnects transistor 710 from the buffer output to reduce power consumption if a user has tied pull up transistors to the buffer output. With OE low, current sinks 1132 and 1134 are also turned on to pull down nodes 312 and 314 to turn off transistors 302 and 304 to provide a high impedance at the buffer output.

To assure the buffer output remains either high or low rather than an intermediate value when the buffer output is tri-stated, FIG. 11 adds inverters 1152, 1154 and 1156, transistor 1158 and resistor 1160 to the circuitry of FIG. 10. Inverters 1154 and 1156 are connected to form a latch with the output of inverter 1154 connected through the source-to-drain path of transistor 1158 to the input of inverter 1156 and the output of inverter 1156 connected to the input of inverter 1154. The output of inverter 1152 is connected to the gate of transistor 1158, while its input is connected to node 312. Resistor 1160 connects the input of inverter 1156 to the buffer output. To provide fast pull up to $V_{DD}$, cell implant transistors are utilized for the pull up transistor of inverter 1152 as well as the pull up transistor of inverter 704 as indicated by a * in FIG. 11.

In operation, with node 312 switching from low to high, the output of inverter 1152 goes high turning off transistor 1158 and allowing the buffer output to pull up to make the input of inverter 1156 high matching the output OUT. After node 312 switches to low, which occurs when the output is tri-stated, the output of inverter 1152 will go high turning on transistor 1158. Thus, the output of inverter 1154 will hold the buffer output high unless pull down transistor 304 switches on sufficiently to pull down the input of inverter 1156 to switch the state of inverter 1154 to low. The low output of inverter 1154 will then hold the buffer output low until node 312 goes back high.

FIG. 11 additionally shows the sizing of transistors making up circuitry of the buffer shown. For the transistors channel width followed by channel length in microns is shown as separated by a space. For inverters, the channel dimension of its transistors is identified along with a p or n indicating the channel type.

Conclusion

Although the invention has been described above with particularity, this was merely to teach one of ordinary skill in the art how to make and use the invention. Many modifications will fall within the scope of the invention, as that scope is defined by the following claims.

What is claimed is:

1. A buffer receiving a first signal (DOUT) at a first input node and a second signal ($\overline{\text{DOUT}}$) which is an inverse of the first signal at a second input node and presenting an output signal (OUT) at an output node, the buffer comprising:

a pull up transistor having a source-to-drain path connected from an upper power supply ($V_{DD}$) to the output node, and having a gate;

a pull down transistor having a source-to-drain path connected from a lower power supply ($V_{SS}$) to the output nodes and having a gate;

a first n-channel switch transistor having a drain coupled to the upper power supply ($V_{DD}$), a source connected to the pull up transistor gate and a gate connected to the first input node;

a second n-channel switch transistor having a drain connected to the pull-up transistor gate, a source connected to a lower power supply ($V_{SS}$) and a gate connected to the second input node;

a third n-channel switch transistor having a drain coupled to the upper power supply ($V_{DD}$), a source connected to the pull down transistor gate and a gate connected to the second input node; and a fourth n-channel switch transistor having a drain connected to the pull-down transistor gate, a source connected to a lower power supply ($V_{SS}$) and a gate connected to the first input node.

2. The buffer of claim 1 further comprising:

a first p-channel switch transistor having a source connected to the upper power supply ($V_{DD}$), a drain connected to the pull up transistor gate, and having a gate;

a first switching means having an output connected to the first p-channel switch transistor gate for turning on the first p-channel switch transistor after the first n-channel switch transistor turns on and for turning off the first p-channel switch transistor after the gate of the pull up transistor is pulled up to the upper power supply ($V_{DD}$);

a second p-channel switch transistor having a source connected to the upper power supply ($V_{DD}$), a drain connected to the pull down transistor gate, and having a gate; and a second switching means having an output connected to the second p-channel switch transistor gate for turning on the second p-channel switch transistor after the third n-channel switch transistor turns on and for turning off the first p-channel switch transistor after the gate of the pull down transistor is pulled up to the upper power supply ($V_{DD}$).

3. The buffer of claim 1 further comprising:

a first p-channel switch transistor having a source connected to the upper power supply ($V_{DD}$), a drain connected to the pull up transistor gate, and having a gate;

a first NAND gate having a first input connected to the first input node, a second input, and an output connected to the first p-channel switch transistor gate;

a first inverter having an input coupled to the pull up transistor gate and an output connected to the second input of the first NAND gate;

a second p-channel switch transistor having a source connected to the upper power supply ($V_{DD}$), a drain connected to the pull down transistor gate, and having a gate;

a second NAND gate having a first input connected to the second input node, a second input, and an output connected to the second p-channel switch transistor gate; and a second inverter having an input coupled to the pull down transistor gate and an output connected to the second input of the second NAND gate 4.

4. The buffer of claim 2 further comprising:

a first power supply switch transistor having a source-to-drain path coupling the drain of the first n-channel switch transistor to the upper power supply ($V_{DD}$), and having a gate;

a second power supply switch transistor having a source-to-drain path coupling a reference having a voltage value between the upper power supply ($V_{DD}$) and the threshold of the pull up transistor to the pull up transistor gate, and having a gate, wherein the first switching means further has outputs connected to the gates of the first and second power supply switch transistors and wherein the first switching means turns off the first power supply switch transistor and turns on the second power supply switch transistor after the pull up transistor gate is pulled up to the upper power supply ($V_{DD}$) and turns on the first power supply switch transistor and turns off the second power supply switch transistor after the pull up transistor turns off;

a third power supply switch transistor having a source-to-drain path coupling the drain of the third n-channel switch transistor to the upper power supply ($V_{DD}$), and having a gate; and a fourth power supply switch transistor having a source-to-drain path coupling a reference having a voltage value between the upper power supply ($V_{DD}$) and the threshold of the pull down transistor to the pull down transistor gate, and having a gate, wherein the second switching means further has outputs connected to the gates of the third and fourth power supply switch transistors and wherein the second switching means turns off the third power supply switch transistor and turns on the fourth power supply switch transistor after the pull down transistor gate is pulled up to the upper power supply ($V_{DD}$) and turns on the third power supply switch transistor and turns off the fourth power supply switch transistor after the pull down transistor turns off.

5. The buffer of claim 4 further comprising a current sink coupled to the output node.

6. The buffer of claim 3 further comprising:

a first power supply switch transistor having a source-to-drain path coupling the drain of the first n-channel switch transistor to the upper power supply ($V_{DD}$), and having a gate;

a second power supply switch transistor having a source-to-drain path coupling a reference having a voltage value between the upper power supply ($V_{DD}$) and the threshold of the pull up transistor to the pull up transistor gate, and having a gate;

a third inverter having an input connected to the pull up transistor gate and an output connected to the first power supply switch transistor gate;

a fourth inverter having an input connected to the output of the third inverter and an output connected to the second power supply switch transistor gate, wherein the first inverter input is connected to the fourth inverter output so that the first inverter input is coupled to the pull up transistor gate by the third and fourth inverters;

a third power supply switch transistor having a source-to-drain path coupling the drain of the third n-channel switch transistor to the upper power supply ($V_{DD}$), and having a gate; and a fourth power supply switch transistor having a source-to-drain path coupling a reference having a voltage value between the upper power supply ($V_{DD}$) and the threshold of the pull down transistor to the pull down transistor gate, and having a gate, a fifth inverter having an input connected to the pull down transistor gate and an output connected to the third power supply switch transistor gate; and a sixth inverter having an input connected to the output of the fifth inverter and an output connected to the fourth power supply switch transistor gate, wherein the second inverter input is connected to the sixth inverter output so that the second inverter input is coupled to the pull down transistor gate by the fifth and sixth inverters.

7. The buffer of claim 6 further comprising:

a current sink transistor having a drain connected to the output node, a source connected to the lower power supply ($V_{SS}$) and a gate connected to a reference potential (PREF).

8. The buffer of claim 3 receiving an output enable signal (OE), the buffer further comprising:

a first power supply switch transistor having a source-to-drain path coupling the drain of the first n-channel switch transistor to the upper power supply ($V_{DD}$), and having a gate;

a second power supply switch transistor having a source-to-drain path coupling a reference to the pull up transistor gate, and having a gate;

a third NAND gate having a first input connected to receive the output enable signal (OE), a second input connected to the pull up transistor gate and an output connected to the first power supply switch transistor gate;

a fourth NAND gate having a first input connected to receive the output enable signal (OE), a second input connected to the output of the third NAND gate and an output connected to the second power supply switch transistor gate, wherein the first inverter input is connected to the fourth NAND gate output so that the first inverter input is coupled to the pull up transistor gate by the third and fourth NAND gates;

a third power supply switch transistor having a source-to-drain path coupling the drain of the third n-channel switch transistor to the upper power supply ($V_{DD}$), and having a gate; and a fourth power supply switch transistor having a source-to-drain path coupling the reference to the pull down transistor gate, and having a gate, a fifth NAND gate having a first input connected to receive the output enable signal (OE), a second input connected to the pull down transistor gate and an output connected to the third power supply switch transistor gate;

a sixth NAND gate having a first input connected to receive the output enable signal (OE), a second input connected to the output of the fifth NAND gate and an output connected to the fourth power supply switch transistor gate, wherein the second inverter input is connected to the sixth NAND gate output so that the second inverter input is coupled to the pull down transistor gate by the fifth and sixth NAND gates;

a first output enable switch transistor having a source connected to a lower power supply ($V_{SS}$), a drain connected to the pull up transistor gate, and having a gate;

a second output enable switch transistor having a source connected to a lower power supply ($V_{SS}$), a drain connected to the pull down transistor gate, and having a gate; and an output enable inverter having an input receiving the output enable signal (OE) and an output connected to the gates of the first and second output enable switch transistors.

9. The buffer of claim 8 further comprising:

a current sink transistor having a source connected to the lower power supply ($V_{SS}$), a gate connected to a reference potential (PREF), and having a drain; and a current sink switching transistor having a source-to-drain path connected on a first end to the output node and on a second end to the current sink transistor drain, and having a gate connected to receive the output enable signal (OE).

10. The buffer of claim 8 further comprising:

a cell implant transistor having a source-to-drain path connected from the source-to-drain path of the second power supply switch transistor to the pull up transistor gate and having a gate connected to the first input node enabling the second power supply switch transistor to couple the reference to the pull up transistor gate.

11. The buffer of claim 10 wherein the source-to-drain path of the fourth power supply switch transistor couples the reference to the pull down transistor gate by being connected between the drain of the third n-channel switch transistor and the reference.

12. The buffer of claim 11 wherein the voltage reference supplies a first voltage (OHV) having a value less than the upper power supply ($V_{DD}$), but greater than a threshold of the pull up transistor to the cell implant transistor, and wherein the voltage reference supplies a second voltage (VREF) having a value less than the upper power supply ($V_{DD}$), but greater than a threshold of the pull down transistor to the third n-channel switch transistor.

13. The buffer of claim 2 receiving a fast/slow mode selection signal (FAST), the buffer further comprising:

a current sink; and a current sink switching transistor having a source-to-drain path connected on a first end to the output node and on a second end to the current sink, and having a gate; and a delay means having an input connected to receive the fast/slow mode selection signal and an output connected to the current sink switching transistor, wherein when the fast/slow mode selection signal indicates a slow mode, the delay means turns off the current sink switching transistor, and wherein when the fast/slow mode selection signal indicates a fast mode, the delay means turns on the current sink switching transistor after the first p-channel switch transistor turns on and for turns off the current sink switching transistor after the first p-channel switch transistor turns off.

14. The buffer of claim 13 further comprising:

a first power supply switch transistor having a source-to-drain path coupling the drain of the first switching transistor to the upper power supply ($V_{DD}$), and having a gate;

a second power supply switch transistor having a source-to-drain path coupling a reference having a voltage value between the upper power supply ($V_{DD}$) and the threshold of the pull up transistor to the pull up transistor gate, and having a gate, wherein the first switching means has an input receiving the fast/slow mode selection and outputs connected to the gates of the first and second power supply switch transistors, wherein when the fast/slow mode selection signal indicates a slow mode, the first switching means turns on the first power supply switch transistor and turns off the second power supply switch transistor, and wherein when the fast/slow mode selection signal indicates a fast mode, the first switching means turns off the first power supply switch transistor and turns on the second power supply switch transistor after the pull up transistor gate is pulled up to the upper power supply ($V_{DD}$) and turns on the first power supply switch transistor and turns off the second power supply switch transistor after the pull up transistor turns off;

a third power supply switch transistor having a source-to-drain path coupling the drain of the third n-channel switch transistor to the upper power supply ($V_{DD}$), and having a gate; and a fourth power supply switch transistor having a source-to-drain path coupling a reference having a voltage value between the upper power supply ($V_{DD}$) and the threshold of the pull down transistor to the pull down transistor gate, and having a gate, wherein the second switching means has an input receiving the fast/slow mode selection signal and outputs connected to the gates of the third and fourth power supply switch transistors, wherein when the fast/slow mode selection signal indicates a slow mode, the second switching means turns on the third power supply switch transistor and turns off the fourth power supply switch transistor, and wherein when the fast/slow mode selection signal indicates a fast mode, the first switching means turns off the third power supply switch transistor and turns on the fourth power supply switch transistor after the pull down transistor gate is pulled up to the upper power supply ($V_{DD}$) and turns on the third power supply switch transistor and turns off the fourth power supply switch transistor after the pull down transistor turns off.

* * * * *